United States Patent [19]

Baba et al.

[11] Patent Number: 4,899,310

[45] Date of Patent: Feb. 6, 1990

[54] SEMICONDUCTOR MEMORY DEVICE HAVING A REGISTER

[75] Inventors: Fumio Baba, Kawasaki; Kazuya Kobayashi, Itabashi; Seiji Enomoto, Seto; Hiroaki Ogawa, Nagoya, all of Japan

[73] Assignees: Fujitsu Limited, Kawasaki; Fujitsu VLSI Limited, Kasugai, both of Japan

[21] Appl. No.: 209,819

[22] Filed: Jun. 22, 1988

[30] Foreign Application Priority Data

Jun. 25, 1987 [JP] Japan .................. 62-158575

[51] Int. Cl.$^4$ ...................... G11C 11/40; G11C 13/00
[52] U.S. Cl. ....................... 365/189.05; 365/230.03; 365/78; 340/799
[58] Field of Search ............... 365/221, 78, 189.05, 365/230.03; 340/799

[56] References Cited

U.S. PATENT DOCUMENTS

| 4,740,923 | 4/1988 | Kaneko et al. | 365/189.05 |
| 4,745,577 | 5/1988 | Ogawa et al. | 365/221 |
| 4,747,081 | 5/1988 | Heilveil et al. | 340/799 |
| 4,758,988 | 7/1988 | Kuo | 365/189.04 |
| 4,796,231 | 1/1989 | Pinkham | 365/189.05 X |
| 4,807,189 | 2/1989 | Pinkham et al. | 365/189.05 X |

*Primary Examiner*—A. J. Heinz
*Assistant Examiner*—Alfonso Garcia
*Attorney, Agent, or Firm*—Armstrong, Nikaido, Marmelstein, Kubovcik & Murray

[57] ABSTRACT

A semiconductor memory device having a register and a memory cell array includes a controlling circuit for disconnecting an input/output circuit from a data bus and turning OFF a transfer gate provided between the register and data bus in a first operation mode and for connecting the input/output circuit to the data bus and turning ON the transfer gate in a second operation mode. In the first operation mode, a data read or write operation is performed between the memory cell array and an external circuit, and alternatively in the second operation mode the data read or write operation is performed between the register and the external circuit.

17 Claims, 12 Drawing Sheets

FIG. 8

| | AT THE TIME OF FALL OF $\overline{RAS}$ | | | | | AT THE TIME OF FALL OF $\overline{CAS}$ | | OPERATION |
|---|---|---|---|---|---|---|---|---|
| | $\overline{CAS}$ | $\overline{TR}/\overline{OE}$ | $\overline{WE}$ | SF | RA0 RA1 | $\overline{WE}$ | DQ0 ~ DQ3 | |
| 1 | H | H | — | H | L   L | H/L | MASK DATA | READ/WRITE FOR MASK REGISTER |
| 2 | H | H | — | H | H   L | H/L | COLOR DATA | READ/WRITE FOR COLOR REGISTER #1 |
| 3 | H | H | — | H | L   H | H/L | COLOR DATA | READ/WRITE FOR COLOR REGISTER #2 |
| 4 | H | H | H | L | COLUMN ADDRESS | H/L | DQ | NORMAL READ/WRITE (MEMORY CELL) |
| 5 | H | H | L | L | COLUMN ADDRESS | L | SELECTION OF ONE OF COLOR REGISTERS | BLOCK WRITE (MEMORY CELL) |
| 6 | H | L | H | — | COLUMN | — | — | READ TRANSFER |
| 7 | H | L | L | — | COLUMN ADDRESS | — | — | WRITE TRANSFER |
| 8 | L | — | — | — | — | — | — | REFREASH |

…

SEMICONDUCTOR MEMORY DEVICE HAVING A REGISTER

BACKGROUND OF THE INVENTION

The present invention generally relates to a semiconductor memory device, and in particular to a semiconductor memory device having a register in addition to memory cells. More particularly, the present invention relates to a random access memory device having a register which can be suitably used as a memory for image processing.

Generally, data write-in and read-out operations with respect to a memory cell of a conventional random access memory device (hereafter simply referred to as a RAM device) are carried out per a predetermined data unit consisting of 1, 4 or 8 bits, (for example). However, such operations cannot sufficiently satisfy various needs of customers. In particular, in the field of image processing, it is required to employ a RAM device which has a very large amount of the storage capacity and can transfer data at a high-speed. Currently, a RAM device capable of satisfying the above requirement has been proposed. For example, 64 kbit and 256 kbit dynamic random access memory devices exclusively designed for the image processing are available.

As the memory capacity per one semiconductor device increases, there exists another requirement for a higher-grade random access memory capable of transferring data at a higher speed and also performing the image processing more simply. From this viewpoint, currently there has been considerable activity in the development of a RAM device which has a register built therein in addition to memory cells to thereby provide special functions. For example, the built-in register may be used as a mask register, which can control, per one bit unit, data to be written into a memory cell. Further, the use of the built-in register makes it possible to update, within one reference cycle, data made up of a predetermined number of bits which exceeds a number of input pins of the RAM device. The RAM device having these special functions can perform the complex image processing at a high-speed. However, it is to be noted that it is impossible to transfer data stored in the built-in register to an external circuit and to directly know the contents of the built-in register. Therefore, validiting the operation of the RAM device becomes very complicated. For example, it is very difficult to find whether an erroneous operation arises from the built-in register or data itself. This disadvantage leads to an increase in a time term taken to develop the RAM device, a more complicated testing procedure thereof, and an increase in cost.

SUMMARY OF THE INVENTION

Accordingly, a general object of the present invention is to provide a novel and useful semiconductor memory device having a register in which the disadvantages of the conventional one have been eliminated.

A more specific object of the present invention is to provide a semiconductor memory device device having a register capable of writing data into a built-in register and reading out data therefrom. Thereby, the validation test of the operation of the DRAM device can be performed with ease. Additionally, a time taken to develop the RAM device can be decreased, and an efficiency in the delivery inspection can be improved.

Another object of the present invention is to provide a semiconductor memory device device having a register capable of accessing the built-in register while accessing the memory cells.

The above objects of the present invention can be achieved by a memory device device having a register comprising a memory cell array has a series of memory cells; a data bus; an input/output circuit provided between the memory cell array and the corresponding data bus; a register for storing predetermined data; and a transfer gate being connected between the data bus and the register. The device also comprises a first data buffer for transferring data on the data bus to an external circuit; and a second data buffer for transferring data derived from the external circuit to the data bus. In addition to the above elements, the device comprises a controlling circuit for disconnecting the input/output circuit from the data bus and turning OFF the transfer gate in a first operation mode and for connecting the input/output circuit to the data bus and turning ON the transfer gate in a second operation mode. In the first operation mode, a data read or write operation is performed between the memory cell array and the external circuit via the data bus and either one of the first and second buffers. Alternatively in the second operation mode the data read or write operation is performed between the register and the external circuit via the transfer gate, the data bus and either one of the first and second buffers.

Other objects, features and advantages of the present invention will become apparent from the following detailed description when read in conjunction with the accompanying drawings.

BRIEF DESCRIPTION OF THE DRAWINGS

FIG. 2 is a view showing how to combine FIGS. 2A through 2C;

FIG. 8 is a view showing signal states of signals used in embodiment;

DETAILED DESCRIPTION

Figure 1:
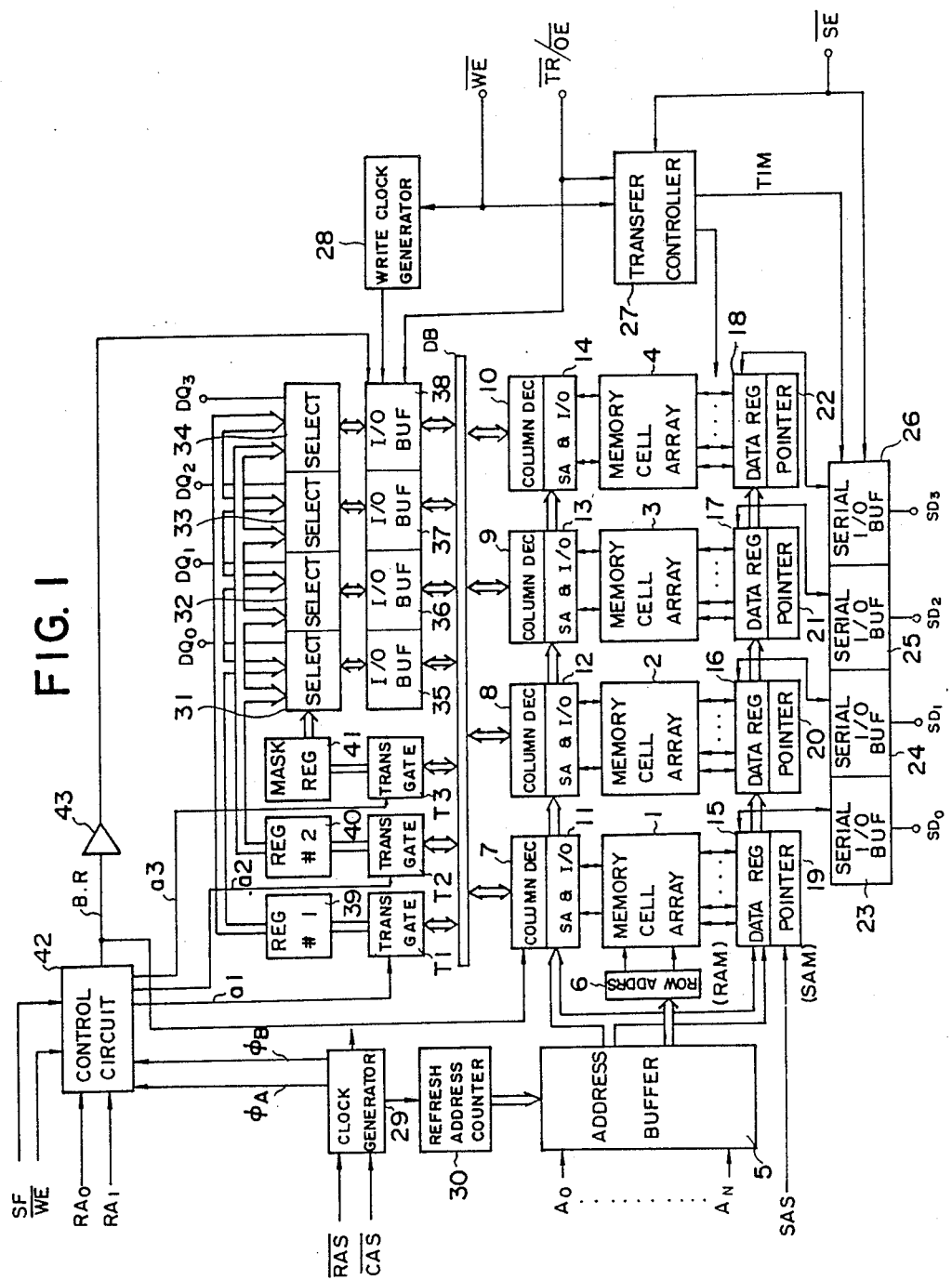
FIG. 1 is a block diagram of a preferred embodiment of the present invention.

FIG. 1 is a block diagram of a preferred embodiment of the present invention. The illustrated configuration is a RAM device of a 4-bit structure designed for the image processing. Referring to FIG. 1, the RAM device includes four memory cell arrays 1 through 4, each of which has a memory capacity of 256 Kbits. The RAM device also includes an address buffer 5 which enters an address signal composed of address bits $A_0$ through $A_N$ (N=7 in the illustrated embodiment), a row address decoder 6, column address decoders 7 through 10 and blocks 11 through 14 each including a sense amplifier and an input/output gate (an I/O gate). The column address decoders 7 through 10 and blocks 11 through 14 are associated with the memory cell arrays 1 through 4, respectively. Data registers 15 through 18 convert parallel data which is outputted from the memory cell arrays 1 through 4 per one row to corresponding serial data. Pointers 19 through 22 select the respective beginning bits of data when the data is read out in the serial form from the data registers 15 through 18. The use of the pointers 19 through 22 can provide an easier scrolling processing. Serial input/output buffers 23 through 26 are used for reading out data from the memory cell arrays 1 through 4 and writing data therein per one row unit. The serial input/out buffers 23 through 26 are controlled by a serial port enable signal ($\overline{SE}$) and a timing signal (TIM) which are supplied from a transfer controller 27. References $SD_0$ though $SD_3$ represent serial data.

The transfer controller 27 inputs a mask mode enable/write enable signal ($\overline{ME/WE}$) and a transfer enable/output enable signal ($\overline{TR/OE}$), both of which are supplied from a memory controlling circuit (not shown) such as a central processing unit. The transfer controller 27 controls a data transferring operation between the memory cell arrays 1 through 4 and the data registers 15 through 18, respectively. Further the transfer controller 27 controls input and output operations of the serial input/output buffers 23 through 26. A write clock generator 28 inputs the mask mode enable/output enable signal $\overline{TR/WE}$, and generates a write clock signal, which is then supplied to input/output buffers 35 through 38. A clock generator 29 inputs a row address strobe signal ($\overline{RAS}$) and a column address strobe signal ($\overline{CAS}$) which are supplied from the memory controlling circuit, and generates inner clock signals $\phi_A$ and $\phi_B$ from the received signal. The clock generator 29 also supplies a refresh address counter 30 with a count signal. The refresh address counter 30 counts the count signal supplied from the clock generator 29 and supplies the address buffer 5 with an address signal for refreshing the memory cell arrays 1 through 4 in order to maintain the data therein.

Selectors 31 through 34 are used for selecting one datum from among data supplied from color data registers 39 and 40, and data $DQ_0$ through $DQ_3$ supplied from the external circuit. The input/output buffers 35 through 38 are controlled by a normal operation mode/block operation mode switching signal B and a register operation mode setting signal R (described later), the transfer enable/output enable signal $\overline{TR/OE}$, and the write clock signal derived from the write clock generator 28. The color data registers 39 (#1) and 40 (#2) are used for storing color data which are frequently used during the image processing. A mask register 41 has a function of inhibiting, per one bit unit, a write-in operation with respect to data $DQ_0$ through $DQ_3$ supplied from the external circuit (not shown).

A control circuit 42 is provided in the RAM device according to the embodiment of the present invention. The control circuit 42 has a function of reading out data stored in the built-in registers consisting of the color data registers 39 and 40 and the mask register 41 to the external circuit, and of writing data supplied from the external circuit into the built-in registers. The control circuit 42 is supplied with a special function signal (SF) and a low active write enable signal ($\overline{WE}$) which are fed from the memory controlling circuit. The control circuit 42 is also provided with row address bits $RA_0$ and $RA_1$ which are a part of the row address signal. The control circuit 42 is further supplied with the clock signals $\phi_A$ and $\phi_B$ which are derived from the clock generator 29. The control circuit 42 produces the register operation mode setting signal R and the normal operation mode/block operation mode switching signal B from the special function signal SF and the write enable signal $\overline{WE}$, and outputs them in synchronism with the clock signals $\phi_A$ and $\phi_B$. The register operation mode setting signal R and the normal operation mode/block operation mode switching signal B are fed to the column decoder 7, and also to the input/output buffers 35 through 38 via a timing adjustment circuit 43. When the register operation mode setting signal R is kept at a high-level (hereafter simply referred to "H"), a write-in operation or a read-out operation may be performed between the registers 39, 40 and 41 and the external circuit. When the normal operation mode/block operation mode switching signal B determines a mode to be selected at the time of writing data into the memory cell arrays 1 through 4 or reading out data therefrom. In the present embodiment, there are two modes which may be selected depending on the normal operation mode/block operation mode switching signal; one of which is a normal mode, and the other of which is a block write-in mode. These modes will be described in detail later. The control circuit 142 also produces register selecting signals $a_1$, $a_2$ and $a_3$, which are supplied to transfer gates $T_1$, $T_2$, and $T_3$ associated with the registers 39, 40 and 41, respectively. When the register operation mode is selected, any one of the registers 39, 40 and 41 is selected by the register selecting signals $a_1$, $a_2$ and $a_3$.

Figure 2A:
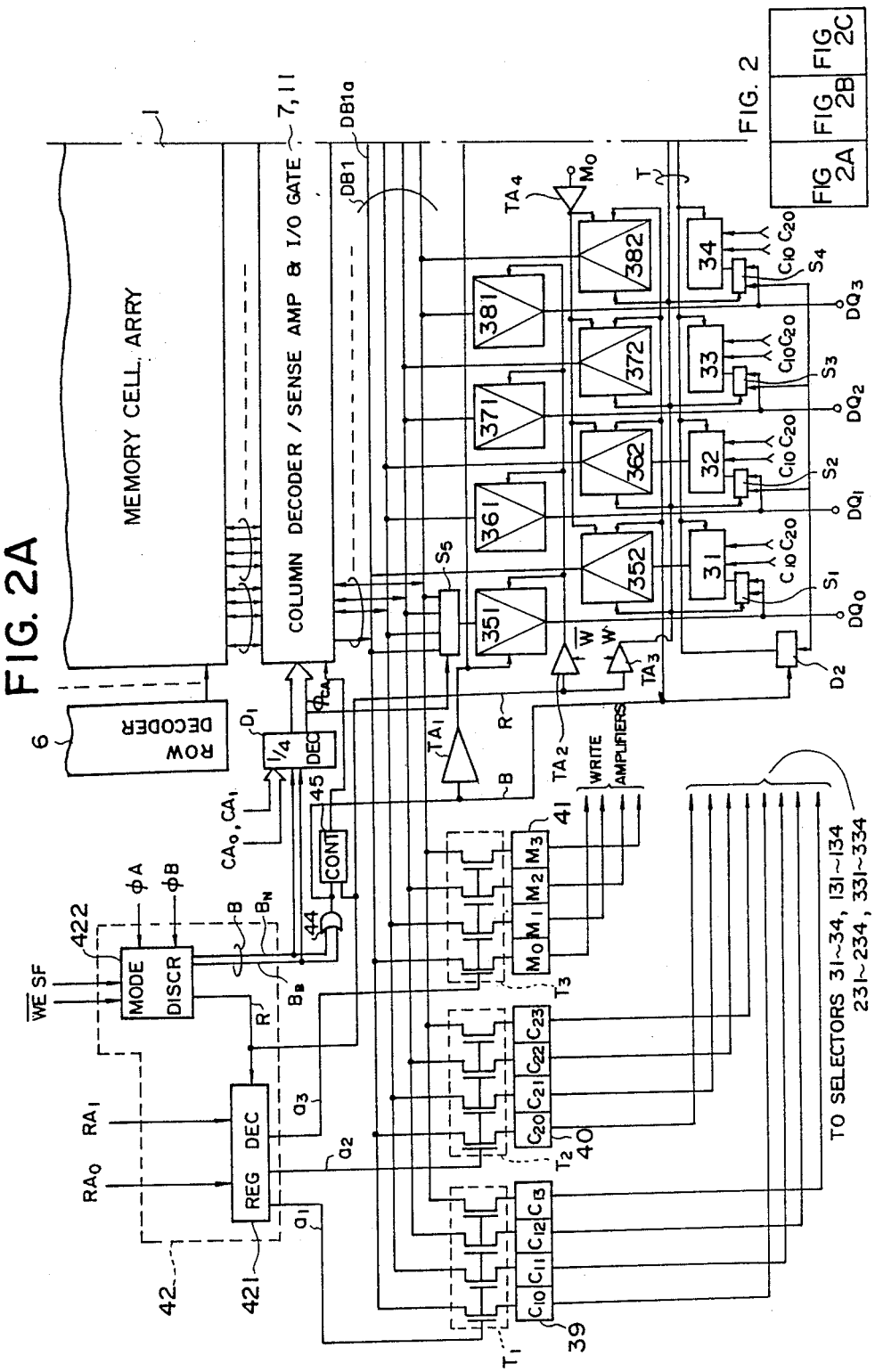
FIGS. 2A through 2C are circuit diagrams of the embodiment shown in FIG. 1.
Figure 2B:
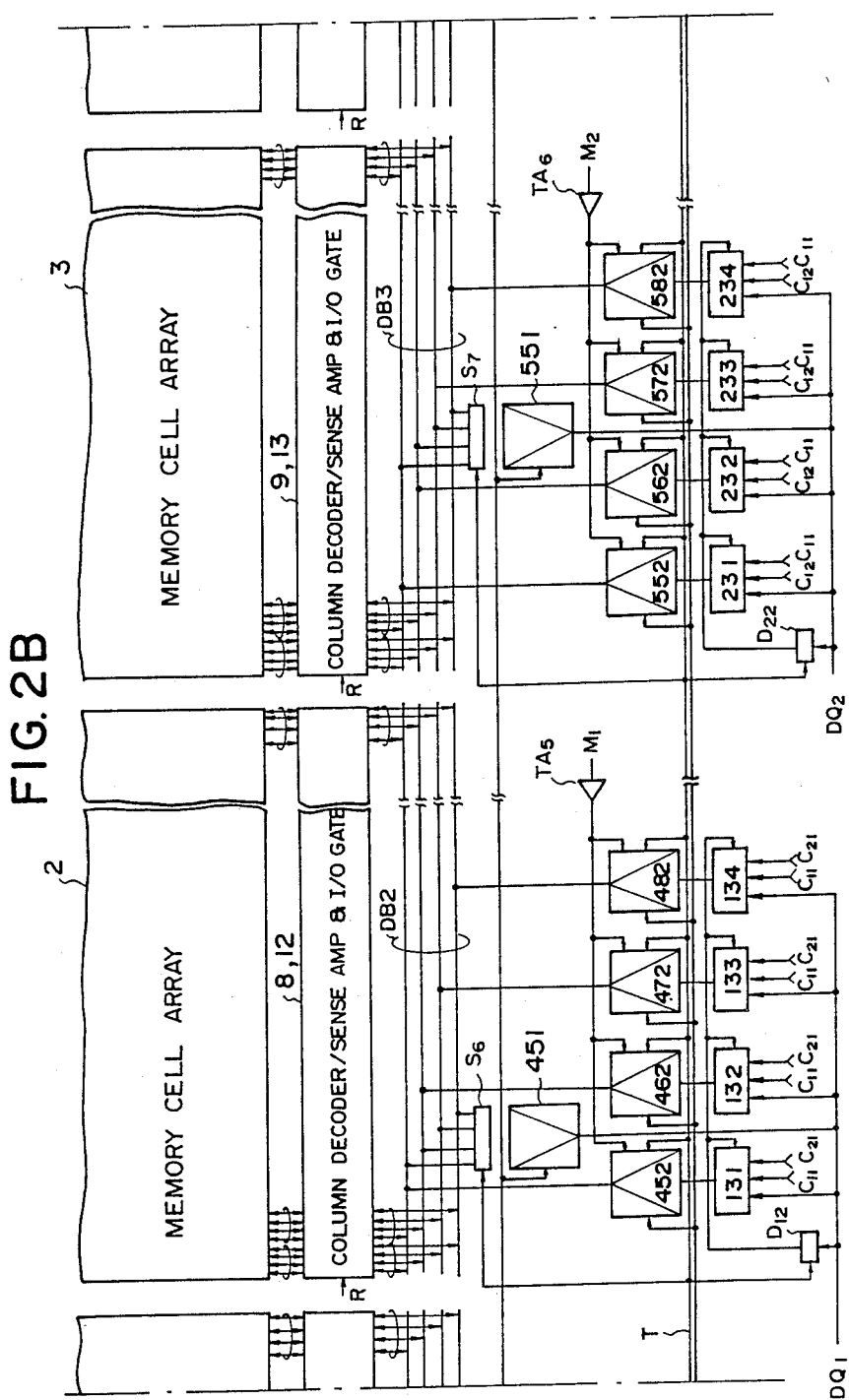
Figure 2C:
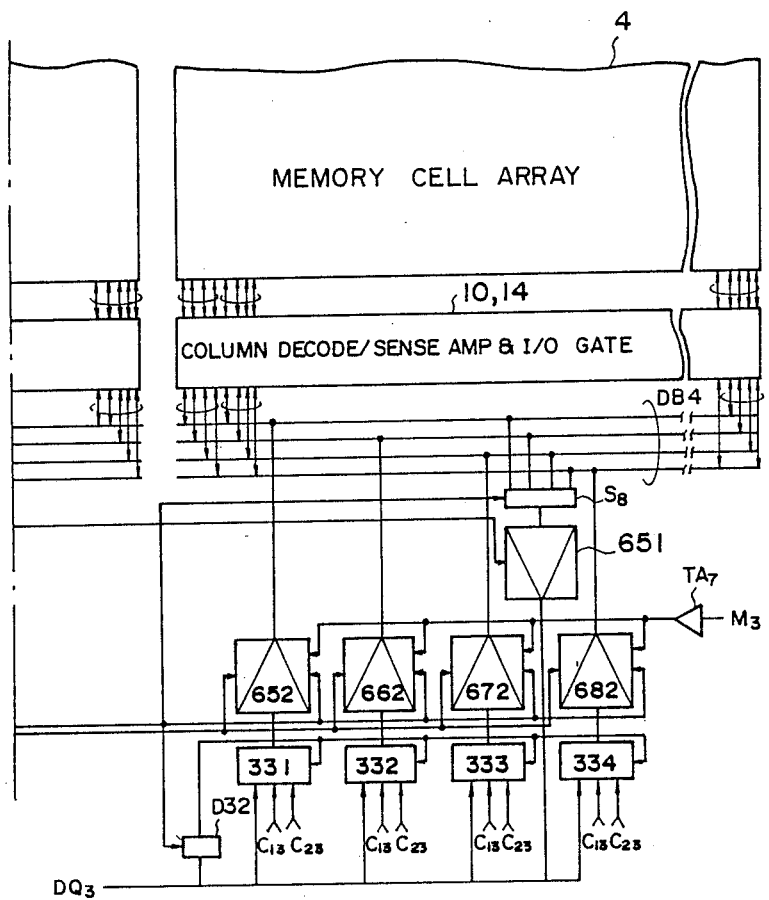

FIGS. 2A through 2C are detailed block diagrams showing the configuration shown in FIG. 1. To begin with, referring to FIG. 2A, the selector 31 is provided with respect to the first data bit $DQ_0$ out of the 4-bit data $DQ_0$ through $DQ_3$. The selector 31 selects one signal from among an output of a selector $S_1$, a lowest digit bit $C_{10}$ of the color register 39, and a lowest digit bit $C_{20}$ of the color register 40. The selectors 32, 33 and 34 are provided with respect to the second, third and fourth data bits of the 4-bit data $DQ_0$ through $DQ_3$. The selectors 32, 33 and 34 have functions similar to that of the selector 31. A register decoder $D_2$ determines which one of the input signals is to be selected, depending on a value of the first data bit $DQ_0$. The register decoder $D_2$ is activated when the register operation mode setting signal R is set at "H". A sense buffer 351 and a write amplifier 352 are provided with respect to the lowest digit bits $C_{10}$ and $C_{20}$ of the color registers 39, and 40. The input/output buffer 35 shown in FIG. 1 is composed of the sense buffer 351 and the write amplifier 352. Similarly the input/output buffers 36, 37 and 38 are composed of sense buffers 361, 371 and 381, and write amplifiers 362, 372 and 382, respectively. The enable/- disable states of the write amplifiers 352, 562, 372 and 382 are controlled by an enable/disable controlling signal T consisting of the normal operation mode/block operation mode switching signal B and an output of a timing adjustment circuit $TA_3$ which delays the register operation mode setting signal R by a predetermined time. The write amplifiers 352, 362, 372 and 382 provided with a lowest bit digit $M_0$ of the 4-bit mask register 41 via a timing adjustment circuit $TA_4$. When the digit $M_0$ is 0, outputs of the write amplifiers 352, 362, 372 and 382 are masked. The output terminals of the write amplifiers 352, 363, 372 and 382 are connected to a data bus $DB_1$ with respect to the memory cell array 1, as shown in FIG. 2A. The enable/disable states of the sense buffers 351, 361, 371, and 381 are controlled by an output signal of a timing adjustment circuit $TA_2$, which delays the register operation mode setting signal R by a predetermined time. Additionally, the enable/disable state of the sense buffer 351 is controlled by an output signal of a timing adjustment circuit $TA_1$, which delays the normal operation mode/block operation mode setting signal B. The sense buffers 361, 371 and 381 are connected to the data bus $DB_1$ as shown in FIG. 2A. The sense buffer 351 is connected to the data bus $DB_1$ via a selector $S_5$, which is controlled by a ¼ address decoder $D_1$ (this is omitted in FIG. 1 for the sake of simplicity).

The color registers 39 and 40 each having the 4-bit structure are connected to the data bus $DB_1$ through the transfer gates $T_1$ and $T_2$, respectively. The transfer gates $T_1$ and $T_2$ are controlled by the register selecting signals $a_1$ and $a_2$, respectively. The lowest digit bits $C_{10}$ and $C_{20}$ of the color registers 39 and 40 are supplied to the selectors 31 through 34 with respect to the memory cell array 1. The second lowest digit bits $C_{11}$ and $C_{21}$ of the color registers 39 and 40 are supplied to selectors 131 through 134 with respect to the memory cell array 2, as shown in FIG. 2B. The third lowest highest digit bits $C_{12}$ and $C_{22}$ of the color registers 39 and 40 are supplied to the selectors 231 through 234, as shown in FIG. 2B. The highest digit bits $C_{13}$ and $C_{23}$ of the color registers 39 and 40 are supplied to the selectors 331 through 334, as shown in FIG. 2C. As shown in FIG. 2B, write amplifiers 452, 462, 472 and 482, a sense amplifier 451 and a selector $S_6$ are provided with respect to the memory cell array 2 which are coupled with a data bus $DB_2$. With respect to the memory cell array 3 coupled with a data bus $DB_3$, there are provided write amplifiers 552, 562, 572 and 582, a sense amplifier 551 and a selector $S_7$. As shown in FIG. 2C, there are provided write amplifiers 652, 662, 672 and 682, a sense amplifier 651 and a selector $S_8$ with respect to the memory cell array 4 which is coupled with the data bus $DB_4$.

Returning to FIG. 2A, the mask register 41 is connected to the data bus $DB_1$ through the transfer gate $T_3$, which is controlled by the register selecting signal $a_3$. The lowest digit bit $M_0$ of the mask register 41 is supplied to the write amplifiers 352, 362, 372 and 382 with respect to the memory cell array 1 via the timing adjustment circuit $TA_4$, as shown in FIG. 2A. The second lowest digit $M_1$ of the mask register 41 is supplied to write amplifiers 452, 462, 472 and 482 with respect to the memory cell array 2 via a timing adjustment circuit $TA_5$, as shown in FIG. 2B. The third lowest digit $M_2$ of the mask register 41 is fed to write amplifiers 552, 562, 572 and 582 with respect to the memory cell array 3 via a timing adjustment circuit $TA_6$, as shown in FIG. 2B. The highest digit $M_3$ of the mask register 41 is supplied to write amplifiers 652, 662, 672 and 682 with respect to the memory cell array 4 via a timing adjustment circuit $TA_7$, as shown in FIG. 2C. Thereby the write-in operation can be inhibited for each digit bit.

The control circuit 42 consists of a register decoder 421 and a mode discrimination circuit 422. The register decoder 421 determines levels of the register selecting signals $a_1$, $a_2$ and $a_3$, depending on the two bits $RA_0$ and $RA_1$ out of the row address signal. For example, when the bit $RA_0$ is at "L", and the bit $RA_1$ is at "L", the register selecting signal $a_3$ is set at "H", and the other signals $a_1$ and $a_2$ are set at "L".

Figure 3:
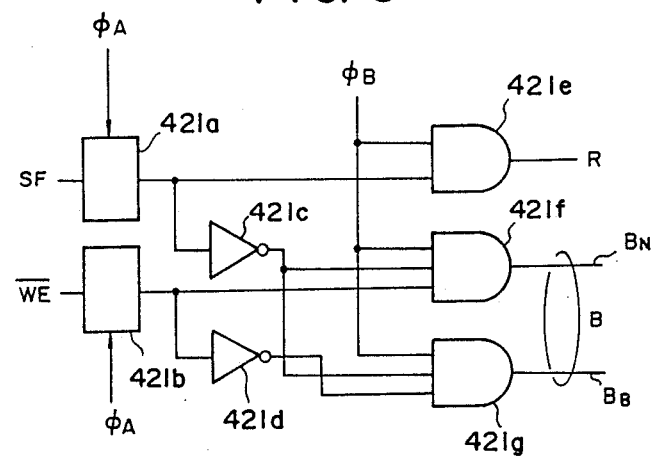
FIG. 3 is a circuit diagram of a mode discrimination circuit shown in FIGS. 1 and 2A.

FIG. 3 is a circuit diagram of the mode discrimination circuit 422. The mode discrimination circuit 422 includes latch circuits 422a and 422b, inverters 421c and 421d, and AND gates 421e, 421f and 421g. The latch circuits 421a and 421b input the special function signal SF and the write enable signal WE in response to the clock $o_{CA}$ derived from the clock generator 29. Outputs of the latch circuits 421a and 421b are fed to the AND gates 421e and 421f and also to inputs of the inverters 421c and 421d, respectively. An output of the inverter 421c is supplied to the AND gates 421f and 421g. An output of the inverter 421d is supplied to the AND gate 421g. The clock signal $\phi_B$ derived from the clock generator 29 is supplied to the AND gates 421e, 421f and 421g. An output of the AND gate 421e is the register operation mode setting signal R. An output of the AND gate 421f is a normal operation mode setting signal $B_N$, and output of the and gate 421g is a block operation mode setting signal $B_B$. The normal operation mode/block operation mode switching signal consists of the signals $B_N$ and $B_B$. The relationship between the input and output of the mode discrimination circuit 422 is shown in TABLE 1.

TABLE 1

At the time of fall
of the signal $\overline{RAS}$

| $\overline{WE}$ | SF | Mode |
|---|---|---|
| H | H | Register mode (R) (read) |
| L | H | Register mode (R) (write) |
| H | L | Normal mode ($B_N$) |
| L | L | Block write mode ($B_B$) |

As described in detail later, when the RAM device is set in the register operation mode, the sense amplifier and I/O gate 11 is disconnected from the data bus $DB_1$. This is achieved by a bus connection/disconnection controlling circuit 45 (this is omitted in FIG. 1 for the sake of simplicity).

Figure 4:
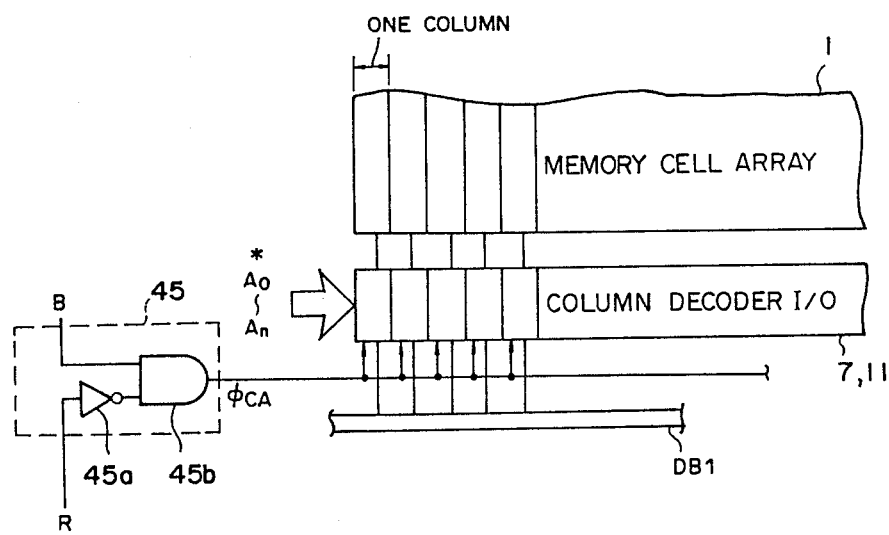
FIG. 4 is a circuit diagram of a circuit for controlling connection/disconnection of a sense amplifier and input/output gate shown in FIGS. 1 and 2A.
Figure 7:
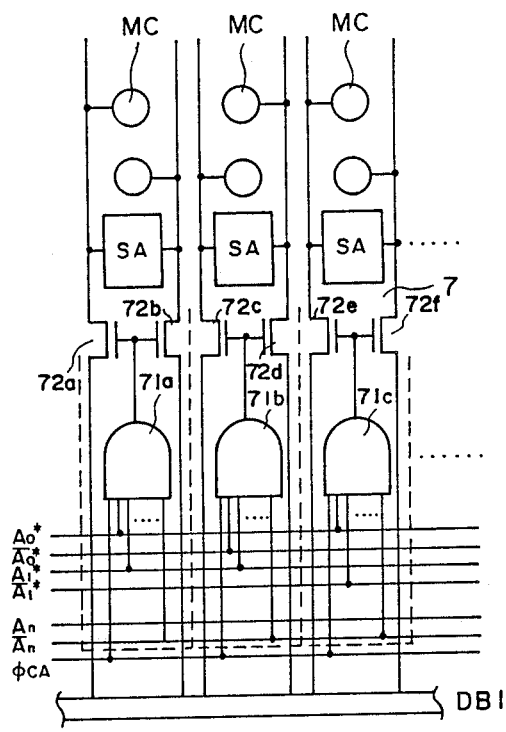
FIG. 7 is a circuit diagram of a column address decoder and the sense amplifier and input/output gates.
Figure 9:
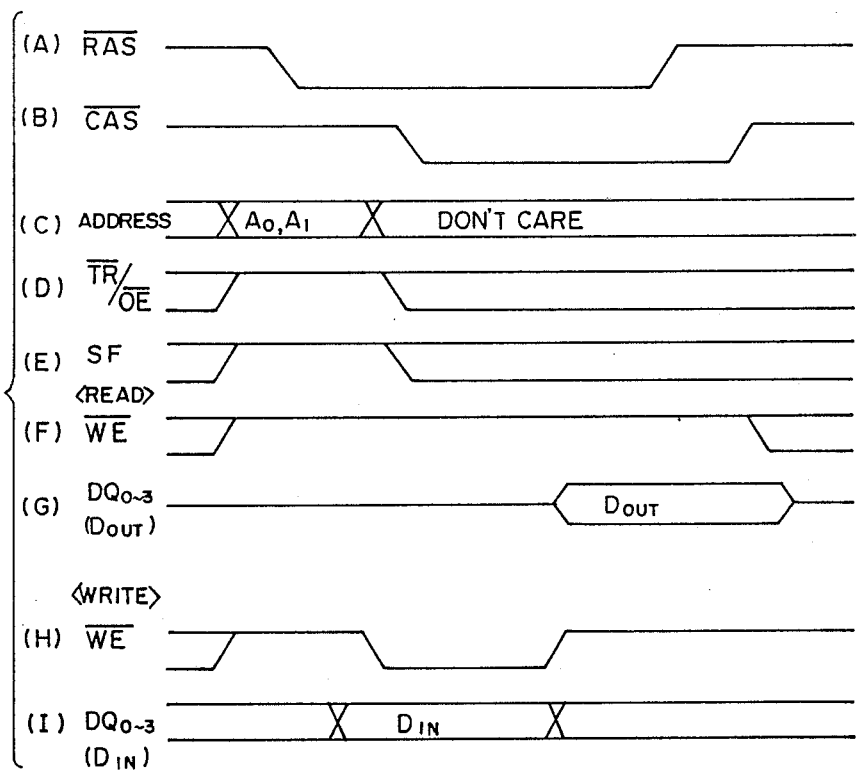
FIGS. 9(A) through 9(I) show waveforms of signals used in a register operation mode in the embodiment.
Figure 10:
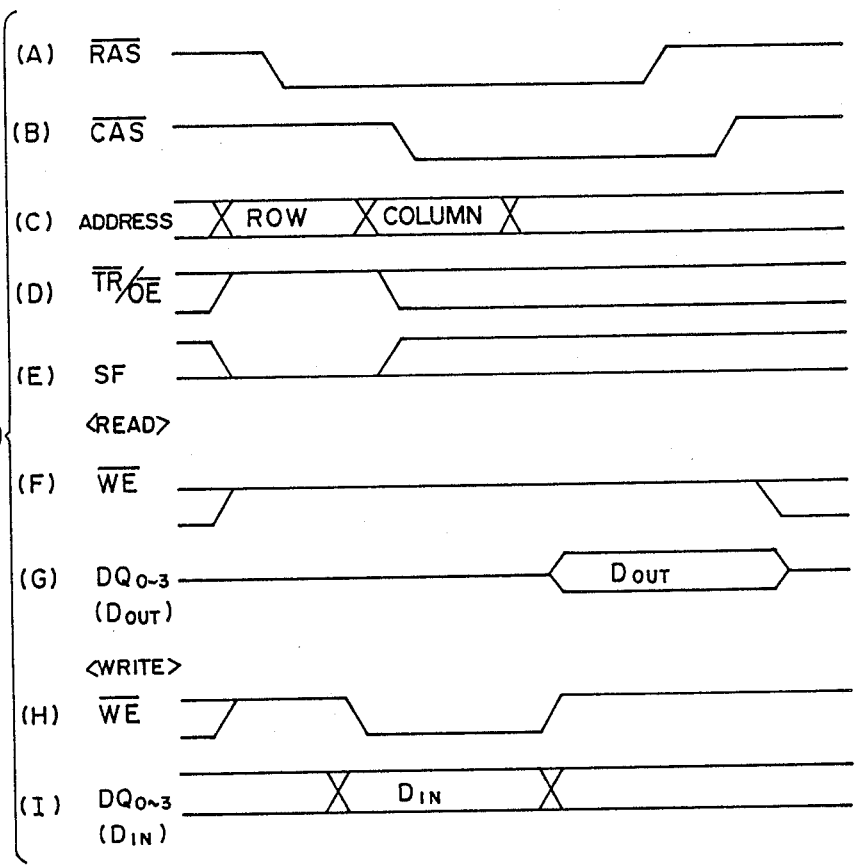
FIGS. 10(A) through 10(I) show waveforms of signals used in a normal operation mode in the embodiment.
Figure 11:
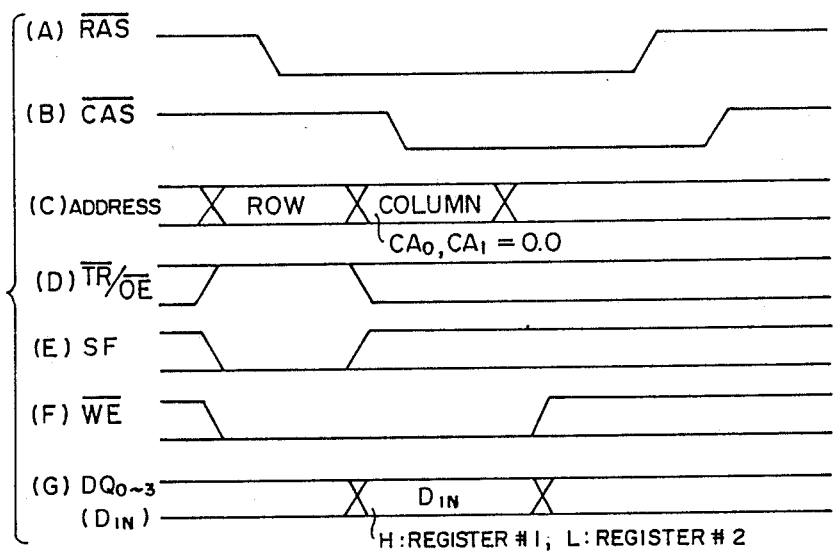
FIGS. 11(A) through 11(G) show waveforms of signals used in a block operation mode in the embodiment.
Figure 12:
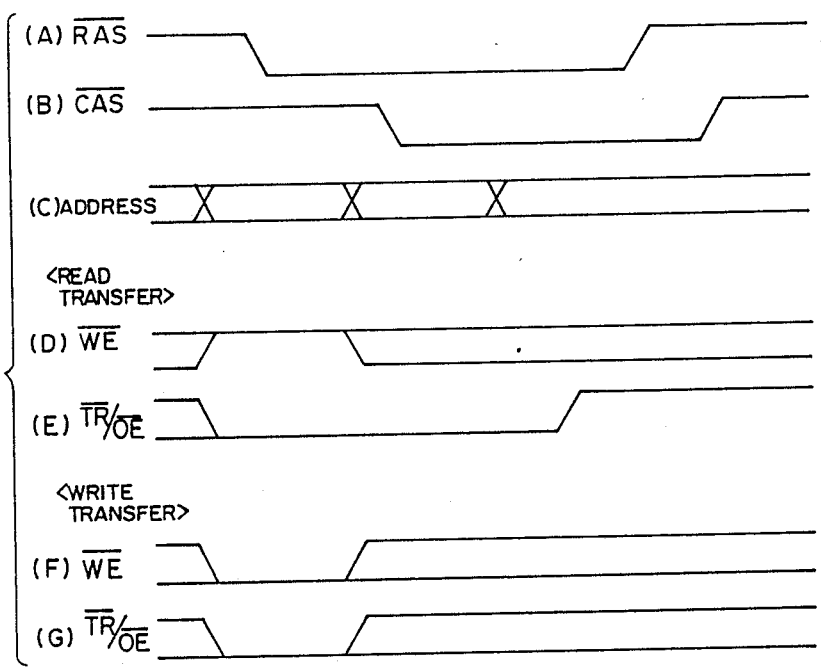
FIGS. 12(A) through 12(G) show waveforms of signals in a read transfer mode and a write transfer mode in the embodiment.

FIG. 4 is a circuit diagram of the bus connection/disconnection controlling circuit 45. As shown, the circuit 45 consists of an inverter 45a and an AND gate 45b. An input of the inverter 45a is supplied with the register mode setting signal R, and an output thereof is fed to the AND gate 45b. The AND gate 45 is also provided with the normal operation mode/block operation mode switching signal B, which is obtained by subjecting the normal operation mode setting signal $B_N$ and the block operation setting signal $B_B$ to an OR operation by an OR gate 44 shown in FIG. 2A (which is omitted in FIG. 1 for the sake of simplicity). When the RAM device is set in the register operation mode, an output ($\phi_{CA}$) of the AND gate 45b which is supplied to each column of the column decoder 7, is kept at "L". The column decoder 7 includes, as shown in FIG. 7, an AND gates 71a, 72a, 73a, . . . for each column. Therefore, during the register operation mode, the AND gates 71a, 72a, 73a, . . . are closed and thereby the sense amplifier and I/O gate 11 is disconnected from the data bus $DB_1$. Thus, the write-in operation and the read-out operation between the color registers 39 and 40 and the external circuit can be achieved.

Figure 5:
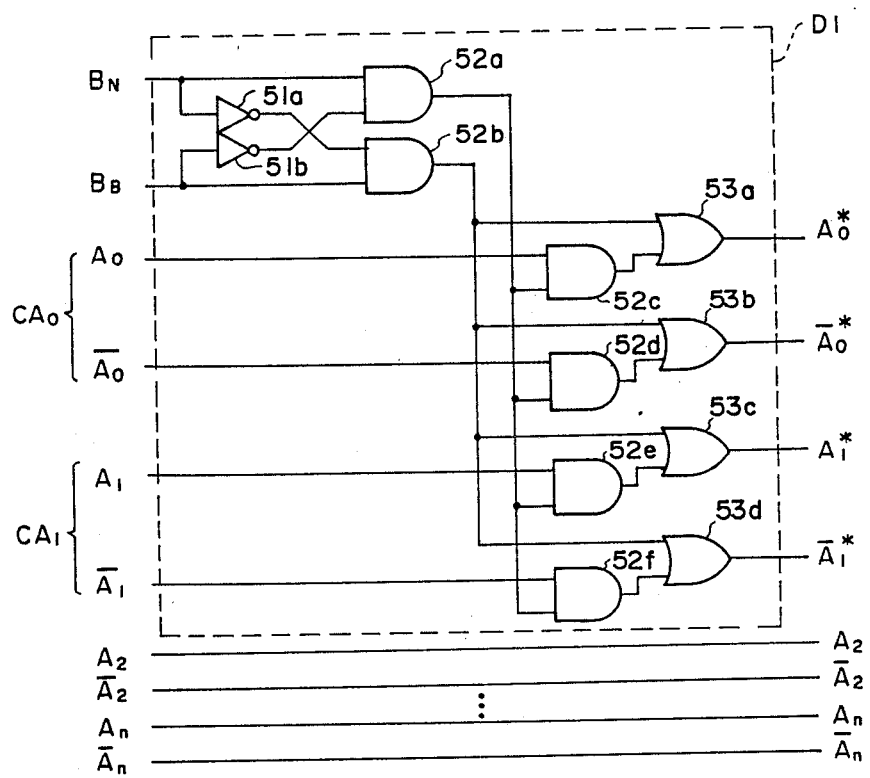
FIG. 5 is a circuit diagram of a ¼ column address decoder shown in FIG. 2A.

FIG. 5 is a circuit diagram of the ¼ address decoder $D_1$ shown in FIG. 2. The ¼ address decoder $D_1$ is composed of inverters 51a and 51b, AND gates 52a through 52f, and OR gates 53a through 53d. The normal operation mode setting signal $B_N$ is supplied to the inverter 51a and the AND gate 52a, and the block operation mode setting signal $B_B$ is supplied to the inverter 51b and AND gate 52b. Outputs of the inverters 51a and 51b are applied to the AND gates 52b and 52a, respectively. An output of the AND gate 52a is fed to the AND gates 52c through 52f, and an output of the AND gate 52b is delivered to the OR gates 53a through 53d. An address bit $A_0$ of the column address signal and its inverted bit $\overline{A_0}$ are supplied to the AND gates 52c and 52d, respectively and an address bit $A_1$ and its inverted bit $\overline{A_1}$ are supplied to the AND gates 52e and 52f, respectively. Outputs of the AND gates 52c through 52f are supplied to the OR gates 53a through 53d. When the RAM device is set in the normal operation mode where the signal $B_N$ is set at "H", and the signal $B_B$ is set at "L", all the gates of AND gates 52c through 52f are opened, and therefore, the address bits $A_0$, $\overline{A_0}$, $A_1$ and $\overline{A_1}$ are allowed to pass therethrough. At this time, because the output of the AND gate 52b is kept at "L", the above address bits are also permitted to pass through the OR gates 53a through 53d. As a result, a column may be selected depending on values of the address bits. On the other hand, when the RAM device is set in the block operation mode where the signal $B_N$ is set at "L" and the signal $B_B$ is set at "H", the output of the AND gate 52b is set at "H". Therefore, all the outputted address bits $A_0^*$, $\overline{A_0}^*$, $A_1^*$ and $\overline{A_1}^*$ are maintained at "H", and consequently four columns can be selected at one time. In FIG. 5, the other address bits $A_2$-$A_n$ (n=7 in the example of FIG. 1) are supplied directly to the column address decoder 7. This will be described in detail later.

Figure 6:
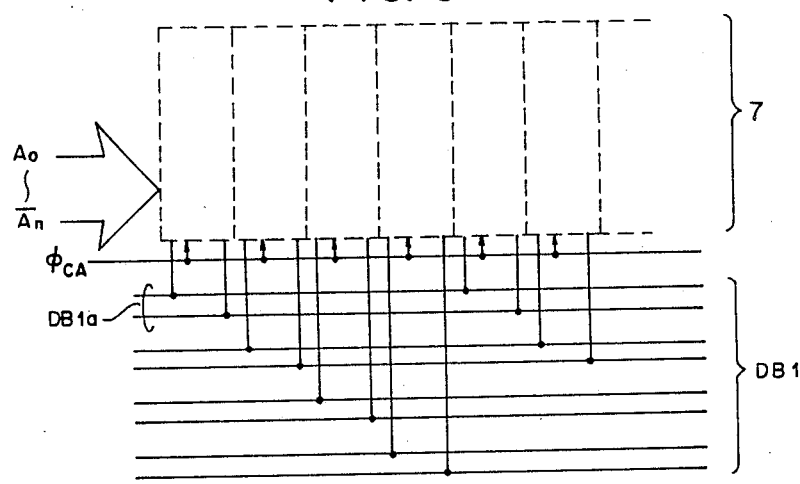
FIG. 6 is a view for showing connections between a column decoder and a data bus.

FIG. 6 shows connections between the data bus $DB_1$ and each column in the column address decoder cell 7. As shown, each column is connected to two bits out of the 8-bit data bus $DB_1$. FIG. 7 shows a circuit configuration of the column address decoder 7 and the sense amplifier and I/O gate 11. As illustrated, the column address decoder 7 is constructed by one AND gate 71a for each of the columns. The sense amplifier and I/O gate 11 is constructed by two MOS transfer gates 72a and 72b and one sense amplifier SA provided for each column. In FIG. 7, a symbol MC is a memory cell.

A description is now given of an operation of the embodiment having the above-described structure with reference to FIG. 8 which is a view showing an operation truth table as well as FIGS. 9 through 12 which are timing charts of the operation of the embodiment. The operation mode of the embodiment can be classified mainly into the register operation mode, the normal operation mode and the block operation mode. A description of the operation is given in this sequence.

REGISTER OPERATION MODE (WRITE)

As shown in FIGS. 9(A) and 9(E), when the row address strobe signal $\overline{RAS}$ is switched to "L", the row address is entered into the memory cell arrays 1 through 4. At this time, the transfer enable/output enable signal $\overline{TR/OE}$ of FIG. 9(D) and the special function signal SF are kept at "H" and "L", respectively. At this time, the column address strobe signal $\overline{CAS}$ of FIG. 9(B) is kept at "H". Then, as shown in FIG. 9(H), the write enable signal $\overline{WE}$ which is a low-active signal is kept at "L". Therefore, the mode discrimination circuit 422 outputs the register operation mode setting signal R which is set at "H". At this time, the normal operation mode setting signal $B_N$ and the block operation mode setting signal $B_B$ are maintained at "L". Because the register operation mode setting signal R is set at "H", the register decoder 421 is enabled. On the other hand, the sense amplifier and I/O gate 11 is disconnected from the data bus $DB_1$, and therefore the memory cell array 1 is disconnected therefrom. This is because the register operation mode setting signal R is set at "H", and therefore the AND gate 45b shown in FIG. 4 produces the control signal $\phi_{C4}$ which is set at "L". Because the write enable signal WE is kept at "L", an inner control signal W is kept at "H", and therefore the timing adjustment circuit $TA_3$ is activated. As a result, the register operation mode setting signal R is allowed to be applied to the write amplifier 352, 362, 372 and 382 via the timing adjustment circuit $TA_3$. Thereby, the write amplifiers 352, 362, 372 and 382 are all enabled. On the other hand, an inner control signal W which is a low-active signal is set at "L", when the write enable signal $\overline{WE}$ is set at "L". Thereby, the register operation mode setting signal R is prevented from being transmitted by the timing adjustment circuit $TA_2$, and all the the sense amplifiers 351, 361, 371 and 381 are disabled. The timing adjustment circuits $TA_2$ and $TA_3$ are provided in order to set the sense amplifiers 351, 361, 371 and 381 and the write amplifiers 352, 362, 372 and 382 in the enable state after the memory cell array 1 is completely disconnected from the data bus $DB_1$.

The selectors 31 through 34 selects the outputs of the selectors $S_1$ through $S_4$, respectively, because they are supplied with the delayed register operation mode setting signal R which is set at "H". At this time, the selectors $S_1$ through $S_4$ select the data $DQ_0$ through $DQ_3$, respectively, because they are supplied with the delayed register operation mode setting signal R which is set at "H". Before the write enable signal $\overline{WE}$ of FIG. 9(H) is switched to "L", as shown in FIG. 9(A), in synchronism with the fall of the row address strobe signal RAS, the row address derived from the row address decoder 6 is entered into the memory cell array 1. At this time, two address bits $RA_0$ and $RA_1$ out of the row address signal is used for selecting any one of the registers 39, 40 and 41. For example, when address bit $RA_0$ is set at "L", and the address bit $RA_1$ is set at "L", the register selecting signal $a_3$ is set at "H", and thereby the transfer gate $T_3$ is turned ON. As a result, the mask register 41 becomes connected to the data bus $DB_1$. In this manner, the data $DQ_0$ is written into the lowest digit bit $M_0$ of the mask register 41 via the selector $S_1$, the selector 31, the write amplifier 352, the data bus $DB_1$ and the transfer gate $T_3$. Similarly, the data $DQ_1$ through $DQ_3$ are written into the regions $M_1$ through $M_3$ of the mask register 41.

REGISTER OPERATION MODE (READ)

As shown in FIGS. 9(A) and 9(E), at the time of the fall of the row address strobe signal $\overline{RAS}$ supplied from the memory controlling circuit, the special function signal SF is set at "H". At this time, the column address strobe signal $\overline{CAS}$ of FIG. 9(B) and the transfer enable/output enable signal $\overline{TR/OE}$ of FIG. 9(D) are kept at "H". Then, as shown in FIG. 9(H), the write enable signal $\overline{WE}$ is kept at "H". Therefore, the mode discrimination circuit 422 outputs the register operation mode setting signal R which is set at "H" as in the case of the write-in operation described before. At this time, the normal operation mode setting signal $B_N$ and the block operation mode setting signal $B_B$ are maintained at "L". Because the register operation mode setting signal R is set at "H", the register decoder 421 is activated. On the other hand, the sense amplifier and I/O gate 11 is disconnected from the data bus $DB_1$, and therefore the memory cell array 1 is disconnected therefrom. This is because the register operation mode setting signal R is set at "H", and therefore the AND gate 45b shown in FIG. 4 produces the control signal $\phi_{CA}$ set at "L". The write enable signal $\overline{WE}$ is kept at "H", and thereby the inner control signal W is kept at "L". Therefore, the timing adjustment circuit $TA_3$ is disabled, so that the write amplifier 352, 362, 372 and 382 are also disactivated. On the other hand, the low-active inner control signal $\overline{W}$ is set at "H", when the write enable signal $\overline{WE}$ is set at "H". Thereby, the register operation mode setting signal R is allowed to pass through the timing adjustment circuit $TA_2$. Consequently, all the the sense amplifiers 351, 361, 371 and 381 are activated.

As shown in FIG. 6, the selector $S_5$ selects only a data line $DB_{1a}$ positioned at the highest order of the data lines of the data bus $DB_1$ in response to the output of the ¼ address decoder $D_1$. Thereby, the sense buffer 351 becomes connected to the bit lines $DB_{1a}$ through the selector $S_5$. In this manner, the data stored in the region $M_0$ of the mask register 41 is applied to the sense buffer 351 through the selector $S_5$. And the data stored in the regions $M_1$ through $M_3$ of the mask register 41 are applied to the sense buffers 361, 371 and 381, respectively. As a result, the data stored in the mask registers 41 can be transferred to the external circuit as the data $DQ_0$ and $DQ_3$.

The register operation mode with respect to the color register 39 or 40 is the same as the operation with respect to the mask register 41.

NORMAL OPERATION MODE (WRITE)

When the row address strobe signal $\overline{RAS}$ is switched to "L" as shown in FIG. 10(A), the row address is supplied to the memory cell arrays 1 through 4. At this time, the special function signal SF is kept at "L", as shown in FIG. 10(E). At this time, the column address strobe signal $\overline{CAS}$ of FIG. 10(B) and the transfer enable/output enable signal $\overline{TR/OE}$ of FIG. 10(D) are maintained at "H". In the write-in operation of the normal operation mode, the write enable signal $\overline{WE}$ is switched to "L". Therefore, the mode discrimination circuit 422 produces the register operation mode setting signal R which is set at "L". Thereby, the register decoder 421 is disabled, and all the register selecting signals $a_1$ through $a_3$ are set at "L". Hence, all the transfer gates $T_1$ through $T_3$ are turned OFF, and the color registers 39 and 40 and the mask register 41 are disconnected from the data bus $DB_1$. On the other hand, the normal operation mode/block operation mode switching signal B which is a result of the OR operation performed by the OR gate 44 shown in FIG. 2A, is kept at "H", and the register operation mode setting signal R is kept at "L". As a result, the AND gate shown in FIG. 4 sets the output $\phi_{CA}$ at "H", so that the column decoder 7 is enabled. Therefore, memory cell array 1 is connected to the data bus $DB_1$. Similarly, the column decoders 8, 9 and 10 are enabled by the application of the control signal $\phi_{CA}$ set at "H" which is derived from the AND gate 45b shown in FIG. 4, so that they are connected to the data buses $DB_2$, $DB_3$ and $DB_4$. The inner control signal W and $\overline{W}$ are set at "H" and "L", respectively, when the write enable signal $\overline{WE}$ of FIG. 10(H) is switched to "L". Therefore, the timing adjustment circuits $TA_2$ and $TA_3$ are disabled and enabled, respectively, and thereby the sense buffers 351, 361, 371 and 381 are disabled, while the write amplifiers 352, 362, 372 and 382 are enabled. At this time, the selector $S_1$ selects the output of the data $DQ_0$ and the selector 31 selects the output of the selector $S_1$. Then in response to the fall of the column address strobe signal $\overline{CAS}$ of FIG. 10(B), the column address is supplied to the memory cell arrays 1 through 4. Then the data $DQ_0$ is written into the memory cell array 1 per four-bit unit via the selectors $S_1$ through $S_4$, the selectors 31 through 34, the write amplifiers 352, 362, 372 and 382, the data bus $DB_1$ and the column decoder 7 in this sequence. Similarly, the data $DQ_2$ through $DQ_4$ are written into the memory cell arrays 2 through 4 per four-bit unit.

NORMAL OPERATION MODE (READ)

When the row address strobe signal $\overline{RAS}$ is switched to "L" as shown in FIG. 10(A), the row address is supplied to the memory cell arrays 1 through 4. At this time, the special function signal SF is kept at "L", as shown in FIG. 10(E). At this time, the column address strobe signal $\overline{CAS}$ of FIG. 10(B) and the transfer enable/output enable signal $\overline{TR/OE}$ of FIG. 10(D) are maintained at "H". In the read-out operation of the normal operation mode, the write enable signal $\overline{WE}$ is switched to "H". At this time, the mode discrimination circuit 422 produces the register operation mode setting signal R which is set at "L" as in the case of the write-in operation of the normal operation mode described before. Hence, all the transfer gates $T_1$ through $T_3$ are turned OFF, and the color registers 39 and 40 and the mask register 41 are disconnected from the data bus $DB_1$ as in the case of the write-in operation of the normal operation mode. On the other hand, the normal operation mode/block operation mode switching signal B which is a result of the OR operation performed by the OR gate 44 shown in FIG. 2A, is kept at "H", while the register operation mode setting signal R is kept at "L". As a result, the AND gate 45b shown in FIG. 4 sets the output $\phi_{CA}$ at "H", so that the column decoder 7 is enabled. Therefore, memory cell array 1 is connected to the data bus $DB_1$. Similarly, the column decoders 8, 9 and 10 are enabled by the application of the control signal $\phi_{CA}$ set at "H" which is derived from the AND gate 45b shown in FIG. 4, so that they are connected to the data buses $DB_2$, $DB_3$ and $DB_4$. The inner control signal W and $\overline{W}$ are set at "L" and "H", respectively, because the write enable signal $\overline{WE}$ is maintained at "H" as shown in FIG. 10(F). Therefore, the timing adjustment circuits $TA_2$ and $TA_3$ are enabled and disabled, respectively, and thereby the sense buffers 351, 361, 371 and 381 are enabled and the write amplifiers 352, 362, 372 and 382 are disabled. At this time, the data which is outputted to the data bus $DB_1$ per four-bit unit is selected by the selector $S_5$, depending on a value of the column address $CA_0$ composed of the address bits $A_0^*$ and $\overline{A}_0^*$ and a value of the $CA_1$ composed of the address bits $A_1^*$ and $\overline{A}_1^*$. The selected data is outputted as the $DQ_0$ via the sense buffer 351. Similarly, the selected data are read out from the memory cell arrays 2 through 4 as the data $DQ_1$ through $DQ_3$, respectively.

BLOCK WRITE OPERATION WITH RESPECT TO THE MEMORY CELL ARRAY

In this operation mode, four mutually adjacent columns can be selected at the same time. This corresponds to nibble bits of the conventional dynamic random access memory. In the following description, it is assumed that data to be written into cells are the contents stored in the color register 39 or 40. Therefore, the data stored in the color register 39 or 40 can be written, at one time, into memory cells per a block unit corresponding to arbitrary four color registers. For example, in the case where the color register is composed of 4 bits, the data can be written into the memory cells per 16-bit unit. Either one of the color registers 39 and 40 can be selected, depending on the level states of the input data $DQ_0$ through $DQ_3$. For example, in the case where the data $DQ_0$ is set at "L", the contents of the color register 40 are data to be written into memory cells in the first columns of four cell blocks (which correspond to four bits by four columns) which are selected by the column address signal. On the other hand, the $DQ_0$ is set at "H", the data stored in the color register 39 is data to be written into memory cells in the first columns of the four memory cell blocks. In the case where the data $DQ_1$ is kept at "H", the contents of the color register 39 are data to be written into memory cells in the second columns of the selected memory cell blocks. Alternatively in the case where the data $DQ_1$ is kept at "L", the contents of the color register 40 are data to be written into memory cells in the second columns of the selected memory cell blocks. Likewise, the data $DQ_2$ is used as data for instructing which one of the color registers 39 and 40 should be selected to be written into memory cells in the third columns of the memory cell blocks. And the data $DQ_3$ is used as data for instructing which one of the color registers 39 and 40 should be selected to be written into memory cells in the fourth columns of the memory cell blocks. For example, when all the data $DQ_1$ through $DQ_3$ are set at "L", the contents stored in the color register 40 are written into memory cells in all of the four columns of one memory cell array.

The block operation mode is further described with reference to FIGS. 11(A) through 11(G). As shown, when the row address strobe signal $\overline{RAS}$ falls, the column address strobe signal $\overline{CAS}$ and the transfer enable signal $\overline{TR/OE}$ are kept at "H". And, at this time, the special function signal SF and the write enable signal $\overline{WE}$ are kept at "L". Then, the row address is entered into the memory cell arrays 1 through 4. Subsequently, when the column address strobe signal $\overline{CAS}$ falls and the write enable signal $\overline{WE}$ is kept at "L", the columns of the memory cell arrays 1 through 4 into which data is to be written. In the block operation mode, the data is written into memory cells per four-bit unit. Therefore, as described before with reference to FIG. 5, the four column address bits $A_0^*$, $\overline{A}_0^*$, $A_1^*$ and $\overline{A}_1^*$ are set to 1, the column address which is selected per the block unit is determined by the other column address bits in addition to the column address bits $A_0^*$, $\overline{A}_0^*$, $A_1^*$ and $\overline{A}_1^*$.

READ/WRITE TRANSFER

This is described by referring to FIGS. 12(A) through 12(G). When the column address strobe signal $\overline{CAS}$ and the write enable signal $\overline{WE}$ are both set at "L" at the time of the fall of the row address strobe signal $\overline{RAS}$, data with respect to one row of each of the memory cell arrays 1 through 4 can be transferred to the data registers 15 through 18 per one row unit at a high-speed. On the other hand, when the column address strobe signal $\overline{CAS}$ and the write enable signal $\overline{WE}$ are set at "H" and "L" at the time of the fall of the row address strobe signal $\overline{RAS}$, data can be transferred to memory cells with respect to one row of each of the memory cell arrays 1 through 4 at a high-speed.

As described above, according to the present invention, the contents of the built-in registers such as registers 39, 40 and 41 can be arbitrarily read out and transferred to the external circuit, and also data derived from the external circuit can be written into the built-in registers. Therefore, it becomes possible to directly know the contents of the built-in registers at any time. This results in an improvement in the validation test of the operation of the RAM device. Additionally, it becomes possible to easily make sure cause of the erroneous operation of the RAM device, for example, to ascertain whether or not the erroneous operation is caused by a fault with respect to the built-in registers.

The present invention is not limited to the embodiment and variations and modifications may be made without departing from the scope of the present invention.

What is claimed is:

1. A semiconductor memory device having a register comprising:
   a memory cell array having memory cells;
   a data bus;
   input/output means provided between the memory cell array and the corresponding data bus;
   register means for storing predetermined data;
   transfer gate means being connected between the data bus and the register means;
   first data buffer means for transferring data on the data bus to an external circuit;
   second data buffer means for transferring data derived from the external circuit to the data bus; and
   controlling means for disconnecting the input/output means from the data bus and turning OFF the transfer gate means in a first operation mode and for connecting the input/output means to the data bus and turning ON the transfer gate means in a second operation mode,
   wherein in the first operation mode, one of a data read operation and write operation is performed between the memory cell array and the external circuit via the data bus and either one of the first and second buffer means, and alternatively in the second operation mode one of the data read operation and write operation is performed between the register means and the external circuit via the transfer gate means, the data bus and either one of the first and second buffer means.

2. A semiconductor memory device as claimed in claim 1, wherein the register means comprises a register for storing color data which is to be written into the memory cell array.

3. A semiconductor memory device as claimed in claim 1, wherein the register means comprises a mask register for storing mask data for disactivating the second data buffer means per one bit unit.

4. A semiconductor memory device as claimed in claim 1, wherein the register means comprises a plurality of registers, and the transfer gate means is provided for each of the plurality of registers, and wherein any one of the plurality of registers is connected to the data bus by turning ON the corresponding transfer gate means in response to a part of an address to be supplied to the memory cell array.

5. A semiconductor memory device as claimed in claim 1, wherein the controlling means comprises mode discrimination means for producing a first operation mode setting signal which instructs the setting of the first operation mode and a second operation mode setting signal which instructs the setting of the second operation mode in response to a predetermined signal supplied from the external circuit, register decoder means for producing a control signal used for controlling ON/OFF of the transfer gate means in response to a part of an address which is to be supplied to the memory cell array, and means for controlling connection and disconnection between the input/output means and the data bus in response to the second operation mode setting signal and the first operation mode setting signal which are produced by the mode discriminating means.

6. A semiconductor memory device as claimed in claim 5, wherein the means for controlling connection and disconnection produces a control signal which varies depending on which one of the first operation mode and the second operation mode is selected, and wherein the input/output means comprises an AND gate which is connected to the data bus and functions an address decoder with respect to the memory cell array, and wherein the means for controlling connection and disconnection produces the control signal such that the AND gate is disactivated when the second operation mode is selected, and wherein the means for controlling connection and disconnection produces the control signal such that the AND gate is activated when the first operation mode signal is selected.

7. A semiconductor memory device as claimed in claim 1, wherein the register means stores data consisting of a plurality of bits, and wherein the second data buffer means comprises a plurality of selectors for selecting one of data supplied from the external circuit and data supplied from the register means in accordance with the selected operation mode, and write amplifiers each provided for the respective selectors and connected to the data bus for amplifying output signals of the corresponding selectors.

8. A semiconductor memory device as claimed in claim 7, wherein the selectors select the data supplied from the register means in the second operation mode.

9. A semiconductor memory device having a register comprising:
a plurality of memory cell arrays each having memory cells;
a plurality of data buses each provided for the respective memory cell arrays;
a plurality of input/output means each provided between the respective memory cell arrays and data buses;
register means connected to any one of the plurality of data buses for storing predetermined data;
transfer gate means being connected between the register means and the data bus to which the register means is connected;
a plurality of first data buffer means each provided for the respective memory cell arrays for transferring data on the respective buses to an external circuit;
a plurality of second data buffer means each provided for the respective memory cell arrays for transferring data derived from the external circuit to the respective data buses; and
controlling means for disconnecting the input/output means from the data bus to which the transfer gate means is connected and turning OFF the transfer gate means in a first operation mode and for connecting the input/output means to the data bus and turning ON the transfer gate means in a second operation mode,
wherein in the first operation mode, one of a data read operation and write operation is performed between the memory cell arrays and the external circuit, and alternatively in the second operation mode one of the data read operation and write operation is performed between the register means and the external circuit.

10. A semiconductor memory device as claimed in claim 9, wherein the register means comprises a plurality of registers each storing a predetermined number of bits, and the transfer gate means comprises a plurality of transfer gates each provided for the respective registers.

11. A semiconductor memory device as claimed in claim 10, wherein each of the plurality of the second buffer means comprises a plurality of selectors for selecting one data bit from among a predetermined data bit contained in the data supplied from the external circuit and a predetermined data bit contained in the data stored in each of the registers, and write amplifiers each provided for the respective selectors and connected to the respective data buses for amplifying output signals of the corresponding selectors.

12. A semiconductor memory device as claimed in claim 11, wherein each of the selectors selects one data bit among the data bits supplied from the registers.

13. A semiconductor memory device as claimed in claim 11, wherein each of the selectors selects one data bit among the data bits supplied from the registers in accordance with a value of the data bit supplied from the external circuit and applied to each selector.

14. A semiconductor memory device as claimed in claim 11, wherein the plurality of registers contains a mask register for storing a predetermined number of mask data bits, and the mask data bits stored in the mask register are supplied to the corresponding write amplifiers provided in each of the plurality of second data buffer means.

15. A semiconductor memory device as claimed in claim 9, wherein the controlling means comprises mode discrimination means for producing a first operation mode setting signal which instructs the setting of the first operation mode and a second operation mode setting signal which instructs the setting of the second operation mode in response to a predetermined signal supplied from the external circuit, register decoder means for producing a control signal used for controlling ON/OFF of the transfer gate means in response to a part of an address which is to be supplied to the memory cell array, and means for controlling connection and disconnection between the input/output means and the data bus in response to the second operation mode setting signal and the first operation mode setting signal which are produced by the mode discriminating means.

16. A semiconductor memory device as claimed in claim 15, wherein the means for controlling connection and disconnection produces a control signal which varies depending on which one of the first operation mode and the second operation mode is selected, and wherein the input/output means comprises an AND gate which is connected to the data bus and functions an address decoder with respect to the memory cell array, and wherein the means for controlling connection and disconnection produces the control signal such that the AND gate is disactivated when the second operation mode is selected, and wherein the means for controlling connection and disconnection produces the control signal such that the AND gate is activated when the first operation mode signal is selected.

17. A semiconductor memory device as claimed in claim 9, wherein the memory device is a memory device for image processing.

* * * * *